(12) United States Patent
Michalk et al.

(10) Patent No.: US 7,727,861 B2
(45) Date of Patent: Jun. 1, 2010

(54) METHOD AND DEVICE FOR CONTACTING SEMICONDUCTOR CHIPS

(75) Inventors: Martin Michalk, Erfurt (DE); Manfred Michalk, Erfurt (DE); Sabine Nieland, Gotha (DE)

(73) Assignee: Assa Abloy AB, Stockholm (SE)

( * ) Notice: Subject to any disclaimer, the term of this patent is extended or adjusted under 35 U.S.C. 154(b) by 324 days.

(21) Appl. No.: 10/570,256

(22) PCT Filed: Aug. 28, 2004

(86) PCT No.: PCT/DE2004/001900
§ 371 (c)(1),
(2), (4) Date: Dec. 14, 2006

(87) PCT Pub. No.: WO2005/027200
PCT Pub. Date: Mar. 24, 2005

(65) Prior Publication Data
US 2007/0163992 A1 Jul. 19, 2007

(30) Foreign Application Priority Data
Sep. 6, 2003 (DE) ................. 103 41 186

(51) Int. Cl.
*H01L 21/00* (2006.01)
(52) U.S. Cl. .................. 438/462; 438/464; 257/797
(58) Field of Classification Search .......... 257/E21.503, 257/E21.511, 797; 438/462, 464
See application file for complete search history.

(56) References Cited
U.S. PATENT DOCUMENTS
4,369,458 A 1/1983 Thomas et al.
6,562,660 B1 * 5/2003 Sakamoto et al. ........... 438/124

(Continued)

FOREIGN PATENT DOCUMENTS
EP    1 143 509    10/2001

(Continued)

OTHER PUBLICATIONS
Aug. 3, 2006 International Search Report, PCT/DE2004/001900.

*Primary Examiner*—Matthew C Landau
*Assistant Examiner*—Vicki B Booker
(74) *Attorney, Agent, or Firm*—Sheridan Ross P.C.

(57) ABSTRACT

The invention relates to a method and device that make it possible to increase the productivity of the chip bonding and the before and after working steps associated with the chip bonding. To this end, the invention provides a method for contacting semiconductor chips (3) on a metallic substrate (16), whereby an etch resist (27) is located at least on one substrate side, and semiconductor chips (3) are contacted on the contacting side (30) by means of flip-chip bonding processes, during which a contacting region (7) is created on the contacting side (30) of the substrate (16). A semiconductor chip (3) having two contact bumps (6) is contacted on said contacting region in such a manner that: a contact bump (6) is contacted on both sides of a structure line (35) or of a structure trench (13) dividing the contacting region (7), and; after the contacting, an underfilling of the chip (3) ensues after which an electrically insulating passage (14) is made in the contacting region (7), and a module (32), which supports the semiconductor chip (3), is removed from the substrate (16).

20 Claims, 7 Drawing Sheets

U.S. PATENT DOCUMENTS

| | | | |
|---|---|---|---|
| 6,778,282 B1 * | 8/2004 | Smets et al. | 356/614 |
| 2001/0009301 A1 * | 7/2001 | Azuma | 257/698 |
| 2002/0027298 A1 * | 3/2002 | Sakamoto et al. | 257/787 |

FOREIGN PATENT DOCUMENTS

| | | |
|---|---|---|
| GB | 2 207 395 | 2/1989 |
| WO | 02/071471 | 9/2002 |

* cited by examiner

METHOD AND DEVICE FOR CONTACTING SEMICONDUCTOR CHIPS

CROSS-REFERENCE TO RELATED APPLICATIONS

This application is the US national phase of international application PCT/DE2004/001900 filed 28 Aug. 2004 which designated the U.S. and claims benefit of DE 103 41 186.0, dated 6 Sept. 2003, the entire content of which is hereby incorporated by reference.

FIELD OF THE INVENTION

The invention relates to a method and a device for contacting semiconductor chips on a metal substrate, on which there is a resist on at least one side and on whose contacting side semiconductor chips are contacted by means of the flip-chip bonding method, as well as to a support strip.

BACKGROUND OF THE INVENTION

The chip bonding method or the so-called flip-chip bonding method are conventionally used in the prior art for contacting semiconductor chips on a substrate.

SUMMARY

The methods described below are customary when contacting semiconductor chips according to the chip bonding method (die bonding), particularly for flat connection of the chip rear side (the opposite surface from the active surface) to a chip support. The chip support is placed in the predetermined region of a bonder, and a semiconductor chip is positioned in an exactly predetermined position in the bonder. A predetermined amount of adhesive is then applied onto the chip support. The semiconductor chip is removed from the predetermined position in the bonder; depending on the delivery method used for the semiconductor chip, the chip may be taken from a gel pack, a blister belt, a waffle pack or from a wafer group cut apart and spread slightly, or from a subsequent centering station. The semiconductor chip is then deposited and slightly pressed onto or into the adhesive bed of the chip support. In a variant of the method and the associated technical equipment arrangement, the adhesive is not applied on the chip support but instead the chip rear side of the chip, held on the active side with a special suction tool, is coated with adhesive by means of a dipping process (brief immersion in an adhesive container) and then deposited on the chip support. Irrespective of which adhesive application method has been selected, curing of the adhesive is then always carried out with a predetermined temperature time process in a subsequent station.

In flip-chip bonding by means of adhesives, after the chip has been taken out of the predetermined position in the bonder, the active chip surface side which points upward (toward the extraction tool) during removal is rotated downward through 180°. Before, during or after this so-called flipping process, position determination and position alignment of the chip are normally carried out again. The intended adhesive is applied as an adhesive paste or adhesive film on the exactly positioned circuit, or the flipped chip is dipped with its active side in a prepared adhesive. The chip is subsequently deposited with the active side on the circuit support, so that the contact bumps of the chip lie on the intended contact surfaces of the circuit receiving the chip. In contrast to chip bonding, a predetermined pressure must be constantly exerted on the chip throughout the subsequent adhesive curing process so that the contact bumps of the chip constantly remain in pressure contact with the contact surfaces of the circuit, sometimes via resilient, electrically conductive fillers of the adhesive, and the pressure contact is converted (frozen) by the cured adhesive into a permanent electrical contact. Soldering processes are also customary.

JP 03-94 430 A discloses a method for contacting a semiconductor chip on an unstructured support plate, bonding it with microwire, encapsulating it with plastic, subsequently applying a resist film on the rear side of the support plate and producing the final support structures of the module, electrically insulated from one another, by etching.

In JP 04-53 237 A, the method is refined so that a structured metal resist film is already present on both sides of the support plate before contacting, and only the etching has to be carried out after encapsulating the chip and the microwires.

An almost identical method is described in DE 100 08 203 A1.

A disadvantage with these methods is that encapsulation of the chip is necessary, and individual chip position errors cannot be taken into account owing to simultaneous or collective chip bonding, and these lead to contacting rejects. The crosslinking of the encapsulation material on the relatively smooth support material is likewise insufficient for thermomechanical loading of the completed module.

DE 198 42 683 A1 provides a method according to which, apart from the surface later covered with plastic, the entire lead frame structure is produced and the chip contacting, the microwire contacting and the plastic encapsulation are carried out on the central, unstructured frame surface. The missing recesses are then introduced into the unstructured frame part, so as to provide the intended mutually insulated parts of the lead frame.

The method corresponds substantially to the aforementioned methods, with the further disadvantage that the module region may be heated unreliably strongly during the proposed structure separation by means of a laser beam, and the semiconductor chip can be damaged.

DE 195 32 755 C1 discloses a method in which bumps are produced on a support frame by deep etching, and these are used for direct chip contacting in the chip-and-wire method. The space below the chip and along the chip periphery is filled with casting resin, which pulls and contacts the chip or the chip pads against the bumps via shrinkage processes (in the case of flip-chip contacting).

Disadvantages are the elaborate support frame production, the need for temporary fastening of the frame on adhesive film and the elaborate adjustment processes when contacting the chips on the bumps.

The method described in US 2001/00 40 286 A1 is likewise based on a support frame which has bonding bumps on the bonding side, the module being encapsulated with resin after the chip bonding and wire bonding. The support frame, which is in one piece during the contacting and encapsulation, is subsequently divided into separate structures by grinding the rear side of the support frame. This method is susceptible to error and elaborate and is unsuitable for modules with a small thickness.

The method specified in U.S. Pat. No. 6,339,261 B1 is suitable for producing flat module arrangements according to the chip-and-wire bonding method, the outer wire contacts being contacted on special contact elements similar to vias. The method is unsuitable for producing very flat flip-chip modules.

US 2002/00 27 298 A1 describes another variant for producing modules, according to which structures are etched from the bonding side into half the material thickness of a one-piece support frame, then the semiconductor chip is contacted and encapsulated and subsequently thinned from the rear side of the support frame until all the structures have been separated.

This method requires extremely precise chip positioning on the support frame, and is therefore unsuitable for position error-prone and/or collective chip contacting according to the flip-chip method.

A similar method is described in DE 197 58 095 C1, according to which a metal foil is fastened on a perforated plastic tape. From the hole side, the chip is adhesively bonded onto the unstructured copper tape, which is structured by laser trimming or mechanical erosion not until after contacting the rear side of the metal tape. A great disadvantage is the high thermomechanical loading of the semiconductor chip during the structuring process.

Method steps for the straightforward removal of very thin separate chips from the wafer group are described in DE 199 62 763 C2 and DE 199 21 230 A1, the chips or all the chips of the wafer being adhesively bonded onto a rigid wafer support. Collection and removal of the chips from the adhesive bed is simplified by applying an adhesive which significantly reduces the adhesive force when heated; the respective chip is heated through the heated chip collection tool. There is, however, the deficiency that the residual adhesive force and the vacuum lying between the chip and the adhesive overall exert forces on the chip which can be greater than the force acting on the chip because of the vacuum of the chip collection tool. Extraction of the chip from the wafer group can thereby be impeded or prevented.

It is an object of the invention to provide a method and a device which make it possible to increase the productivity of chip bonding and the upstream or downstream working steps connected with chip bonding.

According to the invention, the object is achieved by a method which contains the features specified herein and by a support strip which contains features also specified herein.

A chip applicator device suitable for the method is also provided.

Advantageous configurations are specified in the respective dependent claims.

The solution according to the invention uses a thin metal substrate, preferably a metal foil consisting of a material containing copper with a thickness <100 µm, which is coated on both sides with a metal resist that has optimal contacting properties for the subsequent flip-chip contacting and for contacting the outer terminals of the future module. Tin, gold, silver and alloys consisting of these metals are suitable as the photoresist. The resist layers on the future contacting side of the metal foil and the future rear side of the metal foil may consist of different metals. Their thickness is preferably 1 . . . 2 µm.

The resist-coated metal foil is preferably designed as a tape, on which the structures of the future terminals or contacting zones of the module are to be produced parallel and in the tape direction. The resist layers on the contacting side are preferably structured in a first step, structuring being intended to mean removal of the resist in the region of the future etching zones or etching lines. Lines with a width of preferably (10 . . . 50) µm and a line spacing which is less than the smallest internal distance between two flip-chip bumps of the semiconductor chip, minus at least half of the line width, are introduced in a grid network in the region of the chip contacting zone on the contacting side. If chips are to be contacted with only two chip contacts or bumps, then the grid network may be designed as a parallel line network.

The size of the chip contacting zone is equal to or greater than the chip area plus all expected position errors of the chip, if the chip contacting is carried out without optoelectronic and/or mechanical position corrections. In a first step, the etching resist is preferably furthermore removed along the intended outer boundaries of the module terminals. This is preferably done exclusively on the rear side of the substrate. In a variant of the method, structure lines extending perpendicularly to the tape edge, which terminate at end points in the vicinity of the contacting zones lying on the substrate front side, may furthermore be introduced into the etching resist on the substrate rear side. The position of the endpoints on the substrate rear side and the position of the grid network on the substrate front side are in a predetermined position with respect to one another, which is determined by the intended structure, and with a position tolerance which corresponds to about half the etching line width.

The metal tape is preferably etched on the contacting side by selective subsequent etching, the etching depth when etching on one side being preferably half and at most 70% of the metal thickness.

In a second step, the semiconductor chip is bonded onto the metal foil in the region of the contacting zone by means of the flip-chip method. The contacting may be carried out by means of soldering, welding or adhesive bonding.

In parallel with this or in a plurality of subsequent substeps, underfiller is applied and cured between the active chip side and the grid-structured chip contacting zone.

The structure lines, which facilitate the intended separation of the still one-piece metal foil into electrically insulated terminal regions, are introduced under the grid network on the rear side of the metal foil in a third step.

To this end the exact actual positions of the chip are recorded in one substep, before or preferably after the contacting, and the actual positions of the structure line endpoints on the rear side of the metal foil in the vicinity of the contacting zone are simultaneously recorded optoelectronically. The way in which the further missing structure lines on the rear side of the metal foil should extend below the contacting zone is calculated with the aid of these position data, the profile having to be made congruent with a suitable line section of the grid network on the contacting side. The structure lines are subsequently introduced into the etching resist. In a variant of the method, the exact actual positions of the chip and the actual positions of the grid network are recorded. The position profile of the missing structure lines on the rear side of the metal foil is calculated with the aid of these position data.

The metal foil is etched in a fourth step, the still one-piece metal foils being separated into the intended electrically insulated substructures.

The proposed method is distinguished by a number of advantages.

The metal foil provided on both sides with metal resist suitable for the chip contacting and the module contacting can be prepared for the contacting in a first method step, in which structure lines are introduced into the resist on one or both sides and the metal foil is optionally etched on one side. The metal foil remains in one piece and can be easily transported and rolled up. The grid network in the contacting region makes it possible to deposit the chip without paying attention to the exact surface position during placement and subsequent contacting, for example a reflow soldering process or another contacting method throughout the contacting region. Owing to the special grid network, whatever position the chip occupies, every chip contact position can be separated from the other contact positions by one or more structure lines, or by one or more structure trenches in the case of using etched foils. Exact chip positioning and exact chip position insurance are not necessary. In the event that structure trenches are introduced, these structure trenches assist the efflux of excess underfiller possibly applied before the contacting, or capillary influx of the underfiller after contacting, and in particular they improve the adhesion strength of the semiconductor chip on the grid-networked metal foil by increasing the overall adhesive area. The application or influx of the underfiller may also take place after contacting and introducing the still missing structure lines on the lower side of the metal foil, although it must take place before the final etching.

The missing structure lines may be introduced on the substrate rear side below the contacting region after bonding in a further step, it merely being necessary to ensure that the structure lines extend congruently with a grid network subsection on the substrate front side so that the etching front penetrating from the rear side during the subsequent etching reaches the structure trenches respectively etched already on the contacting side, which are intended to separate the chip contacts. The introduction of structure lines and the etching are preferably carried out on specialized equipment.

The chip-specific structure lines are preferably produced by means of a laser scribing beam. The introduction of the grid network lines on the substrate front side and the module separating lines, and the structure line sections branching from the structure lines and leading to endpoints, on the substrate rear side, is expediently carried out by laser irradiation using masks applied on both sides of the substrate and positioned exactly relative to each other. The etching is preferably carried out as a wet etching method. The underfilling is expediently carried out after optoelectronic recording of the exact chip placement position. Certain regions of the metal foil on the contacting side may also be coated after the contacting and in parallel with or after the underfilling, by applying curable polymer lacquer or thermoset, so that the position of the separate metal foil sections with respect to one another is ensured even after the final etching and/or the chip is covered by a protective layer. Overall, the proposed method provides the opportunity to bond i.e. place chips collectively, and to contact them in parallel or in a subsequent step without the risk of positioning error, and to produce the metal structuring in separate steps with fully automatic and simple etching processes. Very thin, optimally contactable modules can be produced very cost-effectively. The metal tape transport can be readily carried out until final separation of the one-piece metal foil. Very cost-effective metal foils coated on two sides can be used. The grid network and the pre-etching lead to a metal foil clinging very gently to the thin semiconductor chip in the contacting region. Even semiconductor chips with a thickness of $\leqq 100$ μm can be connected mechanically stress-free to the metal foil. The heat dissipation from the active chip side is optimal.

If the intention is not to contact the chips collectively, or if the placement accuracy of the chips is so good even in collective contacting that chip-specific recording of the chip placement position is not necessary after the contacting, then the structure lines may already be introduced below the contacting region before the contacting. In this case, it is not necessary to have a grid network on the substrate front side in the contacting region, but only a structure line separating the contacts or a structure trench. In order to optimize the underfilling and in order to increase the adhesion strength of the underfill, encapsulation or thermoset material on the contacting region, it is nevertheless still expedient to arrange a grid network of structure trenches in the contacting region. The structure trench should be selected to be wide enough so that any contact bumps not to be contacted, for example test contacts, lie in the structure trench after the flip-chip contacting. Another possibility is to form wide structure trench sections at the positions of the contacting region over which test contacts, no longer needed for the transponder function and therefore not to be contacted, lie after the flip-chip contacting.

Reflow soldering methods and thermocompression methods can be used for the chip contacting.

It is preferable to select a material which is relatively easy to remove by laser radiation with a wavelength $\leqq 10$ μm as the etching resist. It is furthermore advantageous to use a material which facilitates contacting of the semiconductor chip and other electronic components, or improves the contact making, as the etching resist. Such etching resists may be tin, tin solder, gold and other noble contact metals. It is furthermore advantageous to use a metal etching resist which consists of at least two metal layers with a small thickness, the layer facing the etchant being resistant to the etchant. The metal layers are connected together by alloying, diffusing and/or melting under the effect of heat, for example by exposure to laser light, so as to produce alloys, diffusion zones or unmelted zones in the zones heated by laser radiation, which can be etched by the intended etchant.

It is likewise advantageous to use a metal etching resist which by alloying, diffusing or melting under the effect of heat, for example laser irradiation, forms a connection with the metal support (the core tape) that can be etched by the etchant.

It is furthermore advantageous to use a polymer etching resist or dry film resist conventional in printed circuit board industry as an etching resist on the rear side of the substrate, and to structure it by photochemical and/or thermal processes (for example exposure, development and resist etching).

It is also advantageous to produce or apply an etching resist structured by screen printing or other methods on the contacting side of the substrate. It is particularly advantageous for the etching resist to be used as a thermoplastic or curable adhesive for chips and/or other electronic components in the subsequent contacting step. The adhesive may advantageously be used for temporarily fastening the regions of the metal substrate foil structured by etching technology, which are separated per se after the etching.

BRIEF DESCRIPTION OF THE DRAWINGS

The invention will be explained in more detail below with reference to an exemplary embodiment.

In the associated drawings.

DETAILED DESCRIPTION

With reference now to FIGS. 1-9, exemplary methods, devices, and systems for contacting semiconductor chips will be described in accordance with at least some embodiments of the present invention.

Figure 1A:
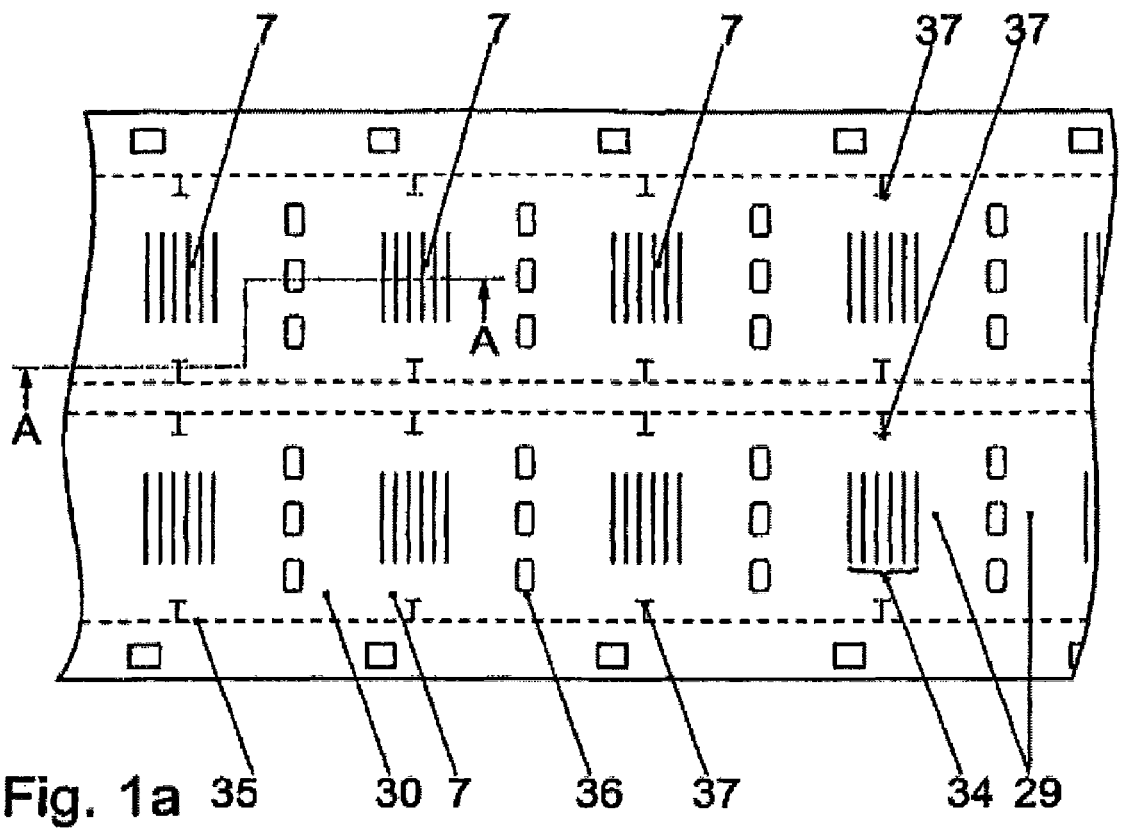
FIG. 1a shows a detail of the contacting side of a tape-shaped metal foil with structure lines and structure trenches in plan view.
Figure 1B:
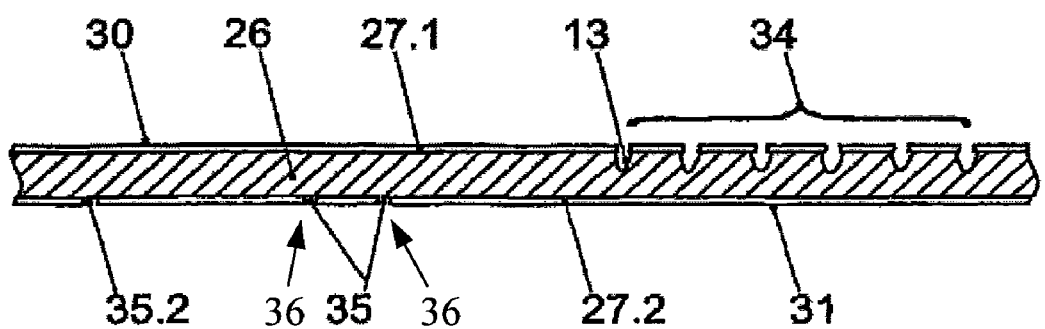
FIG. 1b shows a section view of FIG. 1a across section line A-A.

FIG. 1a represents a detail of a tape-shaped metal foil in plan view, and FIG. 1b in section. The metal foil consists on an 18 μm thick copper foil, the core tape 26, which is coated on both sides respectively with a 2 μm thick tin resist 27.1 and 27.2. The resist material and the resist layer thickness can be selected according to the type of contacting of the chip 3 on the inner module terminals 28 and/or the further circuit with the outer module terminals 29. A 1 μm thick layer may for example be applied on the contacting side 30 of the metal tape, which is used as the substrate 16 of the module 32, while there is a photoresist 27.2 on the rear side 31. The resist layer 27.1 on the contacting side 30, where the chips 3 are subsequently contacted in a chip network array 10, is provided with a parallel linear grid network 34 in the region of the chip contacting zone 7. The size of the grid network 34 is equal to the chip size plus all of the tolerances incurred by taking the chip from the chip store 12 and the chip handling processes. In the example, the size of the chip 3 is $(0.5\times0.5)$ mm$^2$ and the size of the chip contacting zone 7 is $(1.4\times1.4)$ mm$^2$. The structure lines 35 are produced by means of a scribing beam using a YAG laser. The width of the structure lines 35 introduced into the resist layer 27 is 30 μm and the central spacing is 200 μm. The spacing of the 10 μm high contact bumps 6 consisting of gold lying on the active chip side 4 is 250 μm. The contact bumps 6 have a diameter of 90 μm.

The rear side 31 of the substrate 16 likewise has 30 μm wide structure lines 35. The structure lines 35 mark the contour of the future strip-shaped module 32 and the separating positions 36 of the modules 32 from one another. Short structure lines 35, which terminate at endpoints 37, extend in the direction of the contacting zone 7.

After introduction of the structure lines 35 on both sides, the copper of the core tape 26 has been wet chemically etched from the contacting side 30, so as to create approximately 5 . . . 8 μm deep structure trenches 13 on the contacting side 30. The semiconductor chips 3 are contacted on the tape-shaped substrate 16 in the subsequent step.

Figure 2:
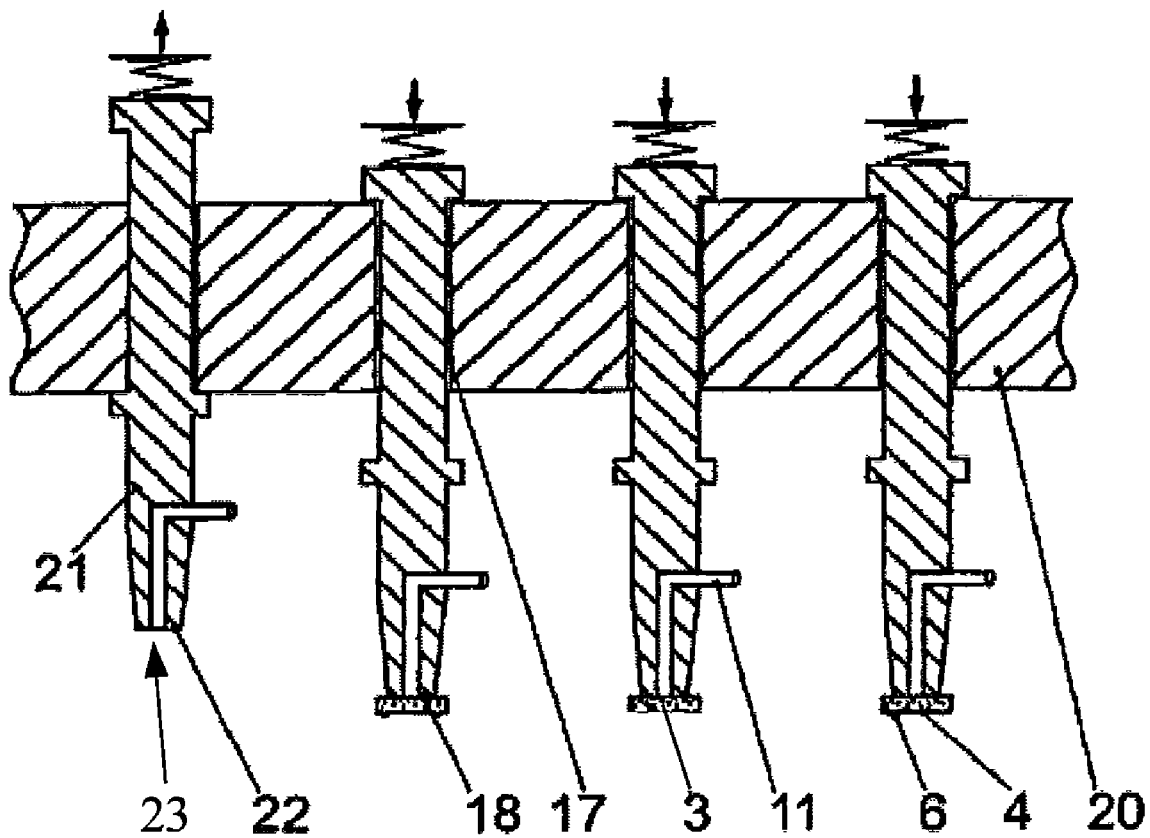
FIG. 2 shows a detail of a chip applicator frame with chip applicators in cross section.

FIG. 2 explains an arrangement which allows both individual and collective chip contacting. Two rows each of four chip applicators 21 are arranged lying successively in the chip applicator frame 20. The chip applicators 21 are arranged at spacings which correspond to a multiple of the network spacing with which the chips 3 are arranged on the wafer 1. Each chip applicator 21 can be controlled in its vertical position and can receive a vacuum for suction of the chips 3. In the embodiment represented, three chip applicators 21 are in the lower position, i.e. the working position 18, and one chip applicator 21 is in the upper position, the standby position 23. In the working position 18, each chip applicator 21 can take a chip 3 from a chip store 12 by switching on the vacuum, and deposit it on the chip contacting zone 7 of the substrate 16 by switching off the vacuum. The chip applicators 21 slide while being controlled and driven by mechanisms (not represented here) vertically in the chip applicator guides 17 arranged in the chip applicator frame 20. When taking or bonding the chips 3, the chip reception surface 22 arranged perpendicularly to the axis of the chip applicator 21 presses on the chip 3 with a force which the chip applicator drive mechanism transmits to the chip applicator 21. In the example described, the force is transmitted via a spring.

One component of the chip applicator 21 is a vacuum channel 11 which is connected to the vacuum control (not represented here) and extends centrally with respect to the chip reception surface 22. The dimensions of the chip reception surfaces 22 are less than or equal to the dimensions of the surface of the chip 3 to be received.

Each chip reception surface 22 of the chip applicators 21 lying in the working position 18 has suctioned a chip 3. The chip rear side 5 lies on the chip reception surface 22, the chip side 4 respectively carries two contact bumps 6 and points downward. The basic surface of the chip 3 measures $(0.5\times0.5)$ mm$^2$ and its thickness 0.15 mm.

The chip applicator frame 20 is part of a chip bonder which can control the chip applicator frame 20 in a plurality of coordinates both for chip reception and in the bonding position. The chip bonder has an image acquisition system for recording the position of the chip contacting zones 7 and can control the chip applicators 21 in the working position 18 or the standby position 23 as well as the vacuum function, and can manage the placement and position of the chips 3 still to be taken from the wafer 1.

Figure 3:
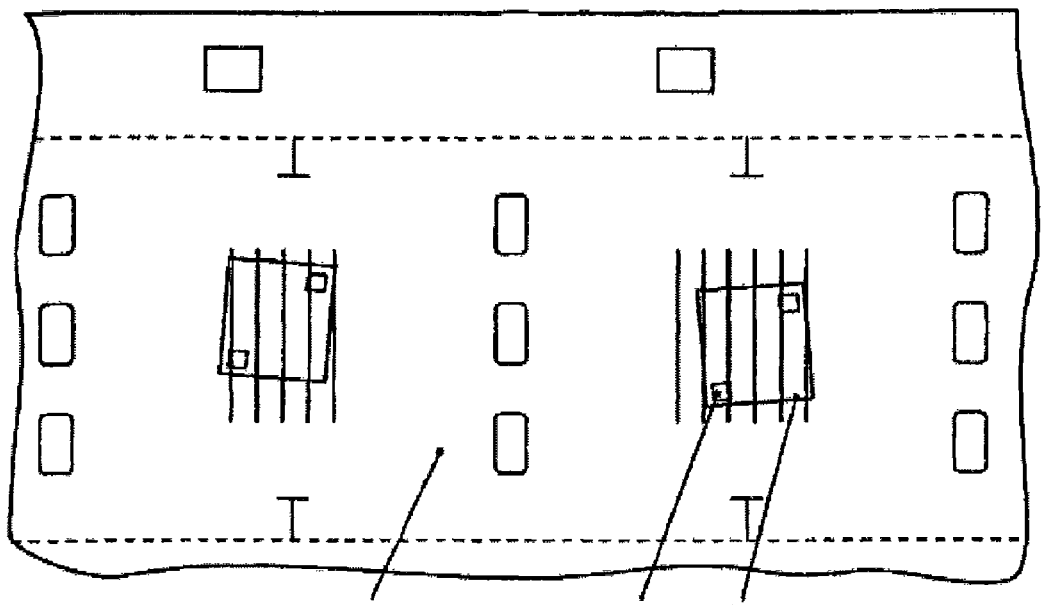
FIG. 3 shows a detail of the contacting side of a chip-equipped panel in plane view.

FIG. 3 shows a detail of a tape-shaped substrate 16, which is provided with structure lines 35 and with structure trenches 13 applied from the contacting side 30, after the chip contacting. Owing to individual position errors of the chips 3, which result from the position tolerances when collecting the chips, during the chip handling, when depositing the chips and during the chip contacting, each chip 3 occupies an individual position on the grid network 34 in the form of parallel lines. The size and spacing of the structure trenches 13 are dimensioned so that the contact bumps 6 are separated by at least one structure trench 13. Each contact bump 6 bears with the majority of its surface on the resist 27.1 consisting of a tin layer. The chip contacting is carried out by means of a reflow soldering method, the underfiller 9 which was deposited as a thin layer on the entire chip contacting zone 7 before contacting having predominantly fluid properties during the soldering process and being cured during subsequent heat treatment.

The missing structure lines 35.2, which extend chip-specifically between the contact bumps 6 of the variously positioned chips 3 on the contacting side 30, are introduced into the resist 27.2 lying on the rear side 31 of the substrate 16 in the next step. Before introduction of the structure lines 35.2, which is likewise carried out using a YAG laser, it is necessary to ensure that the chip-specific structure line 35.2 extends at the same position as a structure trench 13 of the grid network 34 so that in the subsequent etching step which is carried out as wet etching with an alkaline etchant, the copper core layer 26 is etched through from the rear side 31 of the substrate 16 so that there is no etching resist 27 but instead a structure trench section 13 of the grid network 34 on the contacting side 30 at the penetration point 14 of the etched structure trench 13 penetrating from the rear side 31 of the substrate 16. This prevents the metal etching resist 27 from short circuiting the module terminals 28 to be insulated by the etching.

Figure 4:
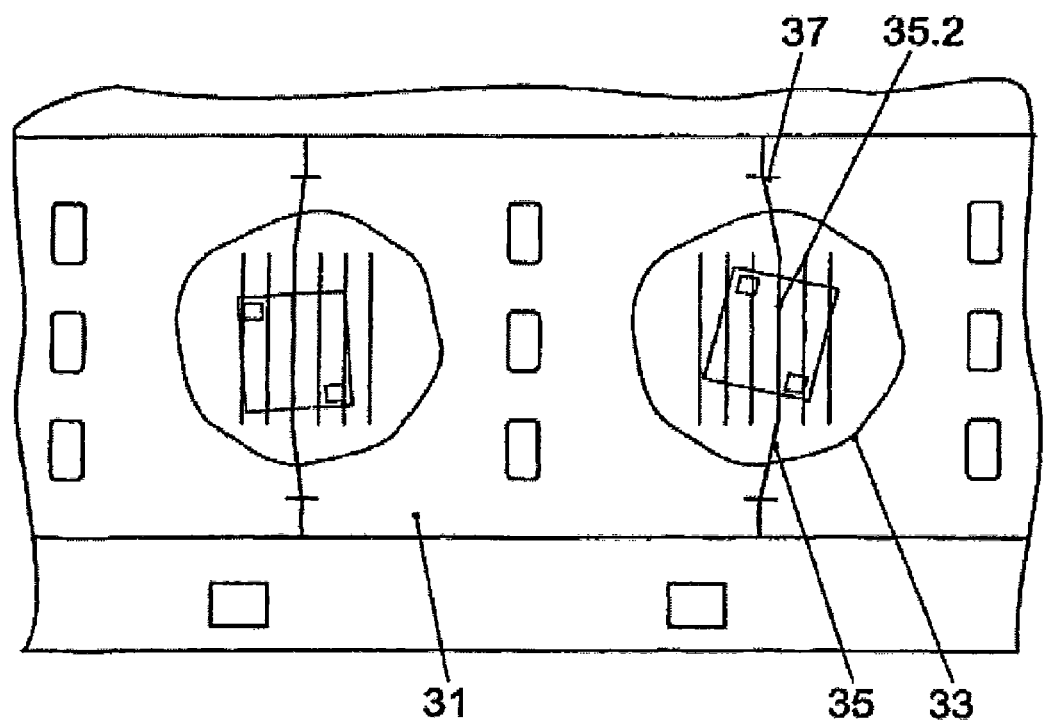
FIG. 4 shows a detail of the rear side of a chip-contacted panel after introduction of the chip-specific structure lines.

The situation after producing the chip-specific structure line 35 on the rear side 31 of the substrate 16 is represented in FIG. 4. The chip-specific structure lines 35.2 connect the endpoints 37 of the structure lines 35 of each substrate rear side 31. To this end, the position of the respective chip 3 on the contacting side 30 and the position of the endpoints 37 of the structure lines 35 on the rear side 31 have been recorded by optoelectronic means, and the profile of the chip-specific structure line 35.2 which always extends congruently with a structure line 35 or a structure trench 13 of the grid network 34 has been determined therefrom. It is likewise possible to arrange defined marking points on the contacting side 30 and calculate the position of the chip-specific structure line 35.2 on the rear side 31 of the substrate 16 therefrom and from the chip position. The defined marking points on the contacting side 30 may be part of the grid network 34.

Figure 5:
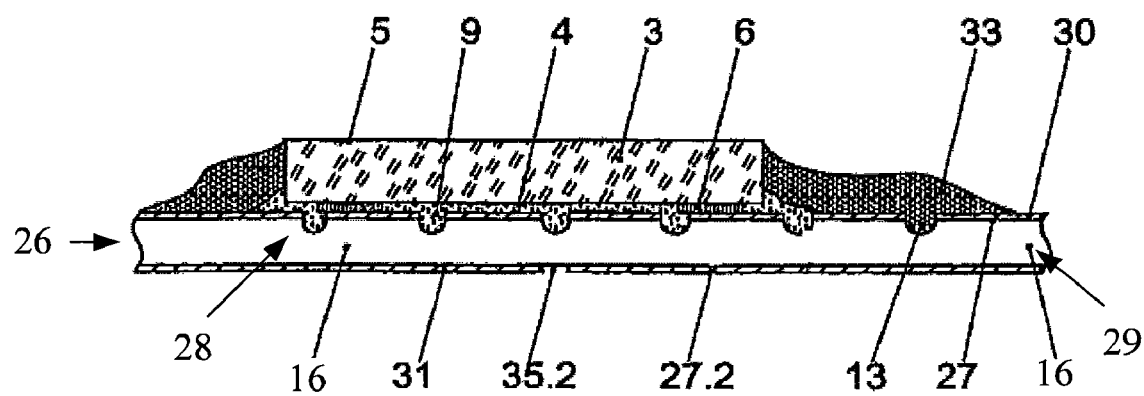
FIG. 5 shows a cross section through a part of the arrangement represented in FIG. 3.

FIG. 5 shows how further protective lacquer 33 is applied on the entire contacting zone 7 after producing the chip-specific structure line 35.2 along the chip contour. After the protective lacquer 33 is cured, it stiffens the metal substrate 16 around the chip 3 and connects the mutually separated inner module terminals 28 in an electrically insulated way.

Figure 5A:
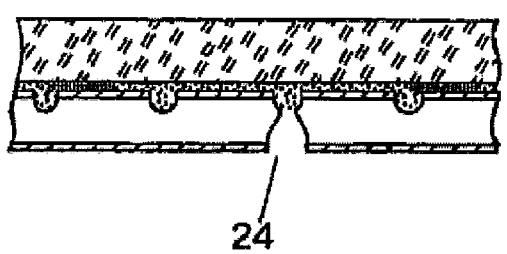
FIG. 5a shows a detail of FIG. 5.

FIG. 5a shows a detail of FIG. 5 after the wet etching. The through-etching 24 connects the structure trenches 13 of the grid network 34 and the chip-specific structure line 35.2.

Figure 6:
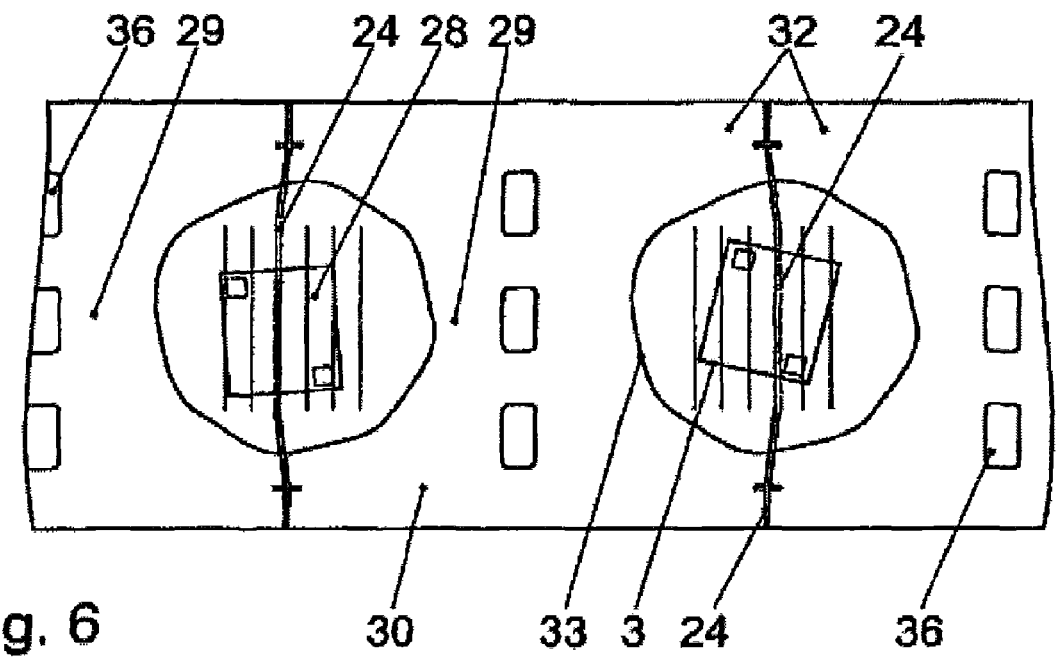
FIG. 6 shows tape-shaped modules etched free in rows in plan view.

The modules 32 whose inner and outer terminals 28 and 29 are arranged opposite as a strip, and the modules 32 which are in turn connected together at their outer terminals 29 to form an endless tape, represented in FIG. 6, are obtained as a result of the subsequent wet etching. The future module divisions are provided by the perforation-like separating positions 36.

Figure 7:
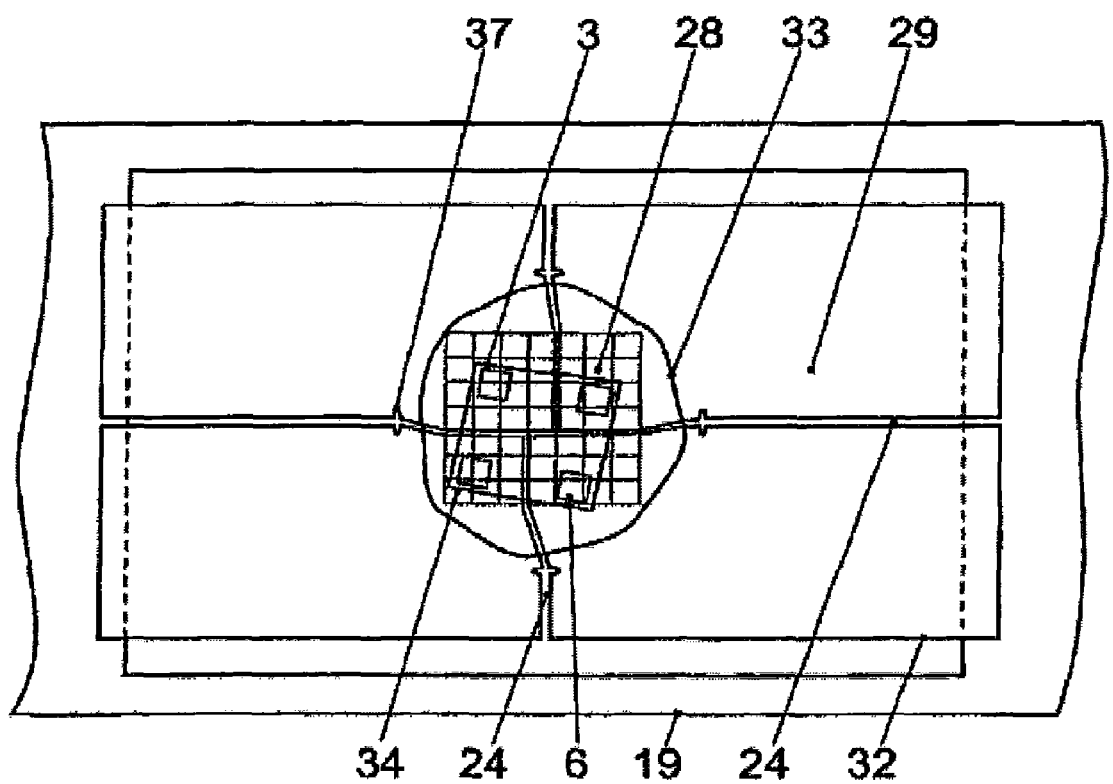
FIG. 7 shows a module arranged on an insulating frame after etching free in plan view.

FIG. 7 represents a module 32 with four module terminals 28 and 29. Electrically insulating base material 19 has been provided with a hole 14 slightly exceeding the future module size in a first step, and a one-piece metal foil 16 of copper with a thickness of 30 μm, whose contacting side 30 and rear side 31 respectively have a 1 μm thick silver layer as resist 27, has been adhesively bonded onto the base material 19. The further steps of the substrate treatment and contacting have been carried out as presented above, merely with the exception that a crossed grid network 34 has been applied on the contacting side 30. After the subsequent etching, a module 32 is obtained which is secured over the hole 14 of the insulating base material 19. The chip 3 and contacting zone 7 are coated with an approximately 100 μm thick stiff protective lacquer 33.

Figure 8:
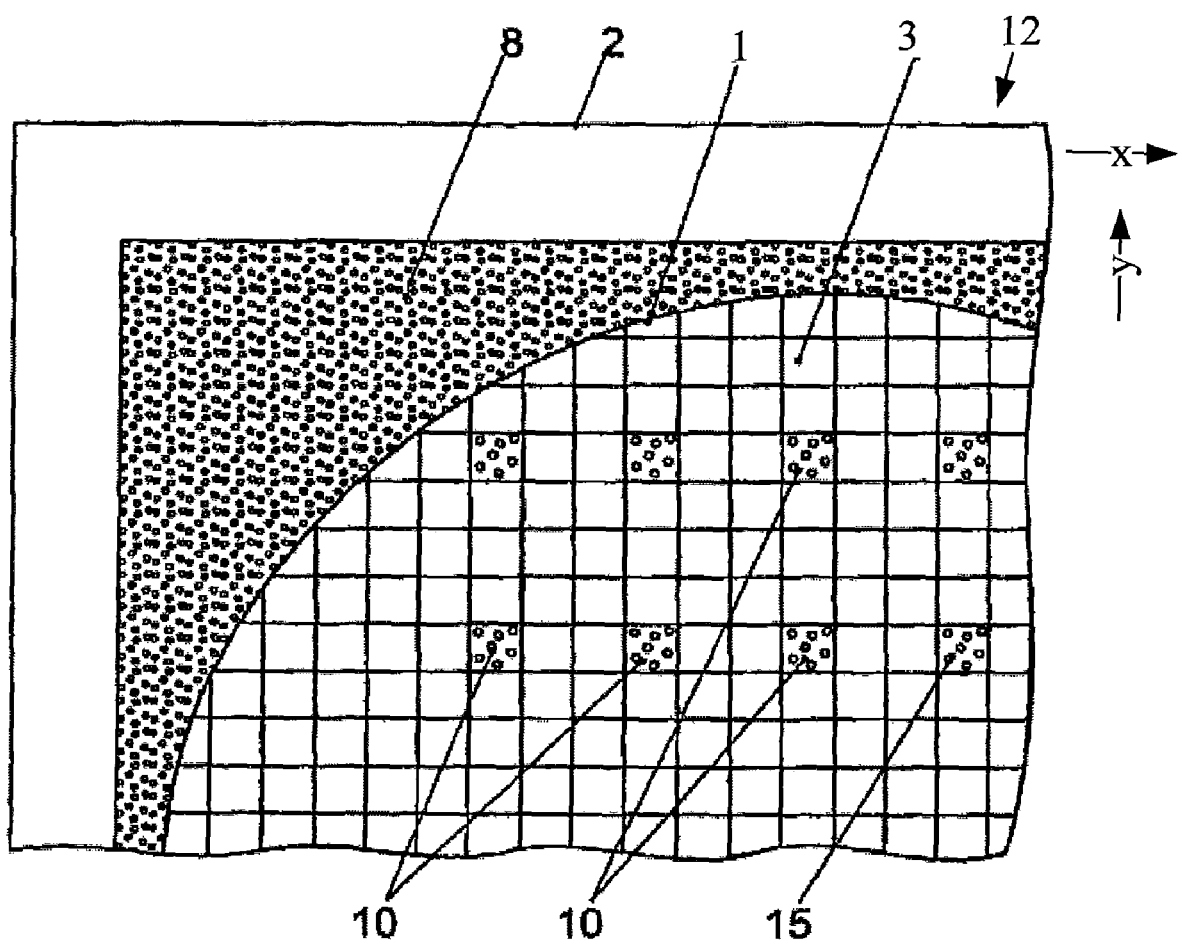
FIG. 8 shows a detail of a wafer support and a chip in plan view.
Figure 9:
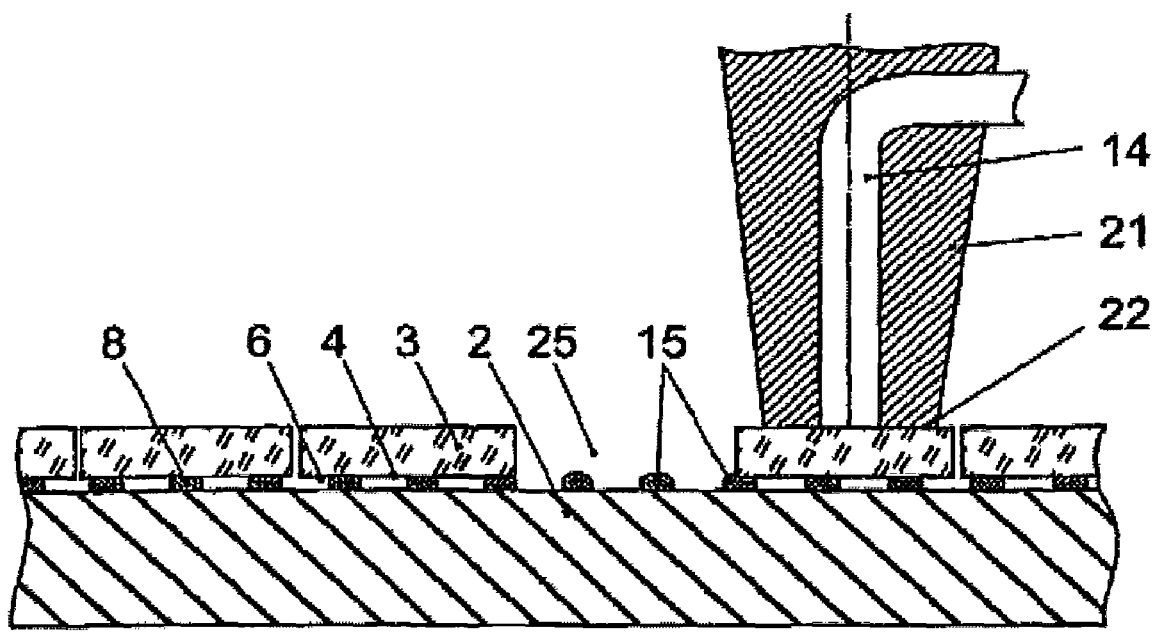
FIG. 9 shows a detail of a wafer support and a chip applicator during chip reception in cross section.

FIG. 8 shows the plan view of a detail of a chip store 12 which, in this example, is formed by the wafer support 2 and the chips 3 still fastened on it in the order of the wafer group. The wafer support 2 consists of an extremely flat rigid surface portion, which exceeds the size of the wafer group by at least 10 mm on all sides and has frame parts for transporting and clamping in the chip bonder. The chips 3, separated by separating trenches which divide the wafer 1 into individual chips 3, lie on the surface portion coated with adhesive 8 in the exact arrangement of the former one-piece wafer 1 with the active side 4 toward the wafer support 2. The adhesive 8 is applied point-wise in a network of (0.3×0.3) mm$^2$, a point size of 60 ...80 μm in diameter and a thickness of approximately 35 μm. Each chip 3 of the separated wafer group is fastened with e.g. six to nine points of the adhesive 8 on the surface portion of the wafer support 2. The adhesive points 8 have a flat cylindrical configuration at room temperature. The bonding strength of the adhesive 8 is substantially higher on the wafer support 2 than on the chip 3. When the adhesive 8 is heated to approximately 80° C., the adhesive 8 changes its contour into a convex contour 15 directed toward the chip side as represented in FIG. 9. The bonding surfaces of the adhesive points 8 with the chip 3 are thereby considerably reduced, so that the chip 3 can be easily taken from the wafer support 2 by the chip reception surfaces 22 of the chip applicator 21, which are heated to greater than or equal to 80° C. Formation of the convex contour 15 entails stretching of the adhesive point 8 in the vertical direction, i.e. in the direction of the chip 3, so that the chip 3 is slightly raised, by 5 μm in the example. Using means (not represented here), the position and location of the chip product 3 on the wafer support 2 is known by the data-processing system of the chip bonder. Using the chip reception surfaces 22, which are heated to at least 100° C., of the eight chip applicators 21 lying in the chip applicator frame 20 which have been placed on the chip rear side 5 for the process of taking the chip 3 from the wafer support 2 or the chip store 12, the chips 3 are heated and the bonding to the surface portion by the adhesive 8 is very greatly reduced by formation of the convex contour 15. The chip heating which produces the convex contour 15 may be carried out in another way, for example with a high-energy light beam which is applied immediately before the chip 3 is actually collected by the chip applicator 21. By simultaneous suction of the chips 3 onto the chip reception surfaces 22, the chips 3 are taken by the chip applicators 21 and removed from the wafer support 2 by raising the entire chip applicator frame 20. Empty positions 25 are left in the separated wafer group of the wafer support 2. The chip applicators 21 are arranged in one array unit of the chip network. The specific arrangement of the chip applicators 21 in the chip applicator frame 20 corresponds to, or is congruent with the arrangement of the chip contacting zones 7 on the substrate 16. In the example represented, the chip network array 10 as shown in FIG. 8 has the factor 4 in the x direction and the factor 5 in the y direction, which corresponds to the row spacing. Following deposition or bonding of the chips 3, the chip applicator frame 20 can take another eight chips 3 after being moved by one chip network. If defective chips are not to be taken, or if the chip applicator 21 is moved to edge regions of the wafer group or wafer support 2 which do not make it possible to take chips 3 in all the chip applicators 21, those chip applicators 21 which are not intended to or cannot take a chip 3 remain in the standby position 23, while the other chip applicators 21 collect chips 3. The chip applicator frame 20 subsequently moves to a new position over the chip store 12 or wafer support 2 and the empty chip applicators 21 are brought into the working position 18, while the filled chip applicators 21 are put into the standby position 23. All the chip applicators 21 of the chip applicator frame 20 are filled by two or more chip collections respectively using other chip applicators 21.

The control of the chip applicator frame 20 and the chip applicators 21, as well as the management of the chip store 12, are carried out using the chip bonder.

LIST OF REFERENCES 1 wafer
2 wafer support
3 chip
4 active chip side
5 chip rear side
6 contact bump
7 chip contacting zone
8 adhesive
9 underfiller
10 chip network array
11 vacuum channel
12 chip store
13 structure trench
14 hole
15 convex contour
16 substrate
17 applicator guide
18 working position
19 base material
20 chip applicator frame
21 chip applicator
22 chip reception surface 23 standby position
24 through-etching
25 empty position
26 core tape
27 resist
    27.1 resist on contacting side
    27.2 resist on rear side
28 inner module terminal
29 outer module terminal
30 contacting side of the substrate
31 rear side of the substrate
32 module
33 protective lacquer
34 grid network
35 structure line
    35.1 structure line on contacting side
    35.2 chip-specific structure line
36 separating position
37 endpoint

The invention claimed is:

1. A method for manufacturing a chip module, whereby chips are contacted on a metal substrate with flip-chip bonding methods, and whereby both a front side and a rear side of the metal substrate are coated with an etching resist, the front side being the side on which the chips are being contacted,
wherein a contacting zone is defined for each chip on the front side, the size of the contacting zone being at least equal to the size of a semiconductor chip plus expected positioning errors of the chip, and said zone is divided at least partially by a plurality of substantially parallel structure lines formed by an absence of the etching resist on the front side of the metal substrate,
wherein the semiconductor chip comprises at least two contact bumps and is contacted on said zone such that the at least two contact bumps are separated from one another by at least one of said structure lines,
wherein the chip is underfilled after the contacting,
wherein the exact position of the chip after contacting on the contacting zone is recorded, and an effective separating structure line is selected from the at least one of said structure lines that separate the at least two contact bumps,
wherein a chip-specific structure line is subsequently formed through the etching resist of the rear side congruently to the effective separating structure line on the front side,
wherein a through-etching is produced by etching between the chip-specific structure line on the rear side and the congruent effective separating structure line on the front side, and
wherein a module carrying the chip is separated from the substrate.

2. The method of claim 1, wherein the semiconductor chip is encapsulated, lacquered or overmolded with thermoset after the underfilling.

3. The method of claim 1, wherein a grid network is formed on the contacting zone in the etching resist by two sets of substantially parallel structure lines and the grid network divides the contacting zone.

4. The method of claim 3, wherein spacing of the structure lines is less than or equal to the spacing of the contact bumps minus half of the structure line width.

5. The method of claim 1, wherein the etching resist comprises a polymer etching resist or dry film resist.

6. The method of claim 3, wherein the grid network structure lines are etched before bonding to form structure lines with a depth of 30 to 70% of the substrate thickness.

7. The method of claim 1, wherein contour lines defining the placement of a main part of the module edges are applied through the etching resist on the rear side.

8. The method of claim 7, wherein short structure lines are applied through etching resist of the rear side, extend from the contour lines toward the contacting zone and terminate at endpoints just outside of the congruent zone on the rear side, and wherein an extension line is formed through the etching resist of the rear side between each extremity of each chip-specific structure line and the nearest endpoint, in order that on the rear side the chip-specific structure lines and the contour lines are forming a connected pattern.

9. The method of claim 8, wherein the position of the chip after contacting on the contacting zone of the front side, respectively the position of each extremity of each selected separating structure line on the front side and of each endpoints on the rear side is recorded by optoelectronic means, and wherein an exact layout of the chip-specific structure lines and of the extension lines on the rear side is then determined based on these recorded positions.

10. The method of claim 1, wherein the chip is underfilled by means of adhesive in parallel with or immediately after the flip-chip bonding.

11. The method of claim 1, wherein at least one of tin, silver, gold, and alloys is used as the etching resist.

12. The method of claim 11, wherein the metal etching resist, which is structured using at least one of a laser and photochemical processes, is used as the resist.

13. A support strip for semiconductor chips, said strip being formed of a metal substrate with a resist layer on a front side of the substrate and a rear side of the substrate, wherein contacting zones for contacting semiconductor chips are formed on said front side in which the resist layer comprises a plurality of structure lines dividing the contacting zones such that contact bumps of a chip are contacted on opposing sides of at least one of said structure lines in a corresponding contacting zone, wherein the exact position of the chip with respect to the position of the structure lines in the corresponding contacting zone is recorded after contacting and an effective separating structure line is selected from the at least one of said structure lines, wherein a chip-specific structure line is subsequently formed through the etching resist of the rear side congruently to the selected effective separating structure line on the front side, and wherein a through-etching is formed between the chip-specific structure line on the rear side and the congruent separating structure line on the front side.

14. The support strip of claim 13, wherein the structure lines dividing the contacting zones have the form of a grid network and are defined by the absence of the etching resist on the front side.

15. The support strip of claim 13, wherein structure lines dividing the contacting zone, which are introduced on the front side and the rear side, are connected to structure lines which are applied along the module edges for future complete separation of the chip from the metal surface.

16. The support strip of claim 13, wherein the structure lines are etched-in on the front side of the substrate to form structure lines with a depth of 30% to 70% of the substrate thickness.

17. The support strip of claim 13, wherein the resist on the front side has grid structures with a network with spacings that are less than or equal to the spacing of the contacts of the semiconductor chips to be contacted and the resist on the rear side has structure lines that extend parallel to a tape edge and perpendicularly thereto to endpoints.

18. The support strip of claim 13, wherein the plurality of structure lines is equal to or greater than the chip area plus expected position errors of the semiconductor chip to be contacted.

19. The support strip of claim 14, wherein the lines of the grid network have a width of from 20 to 40 µm.

20. The support strip of claim 13, wherein the metal substrate is arranged on a plastic support.

* * * * *